(12) United States Patent
Kong

(10) Patent No.: US 7,510,973 B2
(45) Date of Patent: Mar. 31, 2009

(54) METHOD FOR FORMING FINE PATTERN IN SEMICONDUCTOR DEVICE

(75) Inventor: Keun Kyu Kong, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/819,854

(22) Filed: Jun. 29, 2007

(65) Prior Publication Data

US 2008/0160772 A1 Jul. 3, 2008

(30) Foreign Application Priority Data

Dec. 28, 2006 (KR) .................... 10-2006-0137028

(51) Int. Cl.
*H01L 21/311* (2006.01)

(52) U.S. Cl. .............. 438/691; 438/692; 438/702; 438/743; 438/950; 257/E21.039

(58) Field of Classification Search ............ None
See application file for complete search history.

(56) References Cited

U.S. PATENT DOCUMENTS

| 7,202,174 | B1* | 4/2007 | Jung et al. ............... 438/694 |
| 2006/0240361 | A1* | 10/2006 | Lee et al. ................ 430/313 |
| 2007/0117314 | A1* | 5/2007 | Ozawa .................... 438/254 |
| 2007/0158756 | A1* | 7/2007 | Dreeskornfeld et al. ..... 257/374 |

FOREIGN PATENT DOCUMENTS

| KR | 10-2003-0002145 A | 1/2003 |
| KR | 10-2005-0002513 A | 1/2005 |

* cited by examiner

*Primary Examiner*—George Fourson
(74) *Attorney, Agent, or Firm*—Finnegan, Henderson, Farabow, Garrett & Dunner, L.L.P.

(57) ABSTRACT

A method for forming a fine pattern in a semiconductor device is provided. In one aspect, the method can construct a fine pattern in semiconductor devices. The fine pattern has a critical dimension that overcomes the resolution limit of an exposure equipment.

12 Claims, 6 Drawing Sheets

METHOD FOR FORMING FINE PATTERN IN SEMICONDUCTOR DEVICE

CROSS-REFERENCE TO RELATED APPLICATIONS

The present application claims the benefit of priority to Korean patent application number 10-2006-0137028, filed on Dec. 28, 2006, the entire contents of which are incorporated herein by reference.

BACKGROUND

The present invention relates to a semiconductor device. More particularly, the present invention relates to a method for forming a fine pattern in a semiconductor device.

The degree of integration of semiconductor devices depends on the fineness of patterns one can construct in the semiconductor devices. To increase the capacity of a memory chip, the size of the memory chip needs to be increased. However, the size of a cell region of the memory chip, on which fine patterns are formed, is practically decreased. Since more patterns are to be formed in the limited cell region to secure desired memory capacity, it is necessary to construct a fine pattern, such that the width of the fine pattern is less than the critical dimension. As a result, it is desired to develop a photolithography process for forming such a fine pattern.

In order to form a pattern by a photolithography process, a photoresist ("PR") film is coated over a target layer to be patterned. Next, an exposure process is performed to change the solubility of the PR film at a given portion. Subsequently, a developing process is performed to form a PR pattern that exposes the target layer. The PR pattern is formed by removing the portion whose solubility has been changed, or by removing the portion whose solubility has not changed. Later, the exposed target layer is etched using the PR pattern, and then the PR pattern is stripped off to form a target layer pattern.

In the photolithography process, resolution and depth of focus ("DOF") are two important measures. Resolution (R) can be expressed by Equation 1 below.

$$R = k_1 \frac{\lambda}{NA}, \quad (1)$$

where $k_1$ is a constant determined by the material and the thicknesses of the PR film, $\lambda$ is the wavelength of a light source, and NA stands for the "numerical aperture" of an exposure equipment.

Since $k_1$ has a physical limitation, it is difficult to reduce $k_1$ by an existing method. Thus, there is a need to develop a new exposure equipment that employs a light source having a narrow band, and a new photoresist material that effectively responds to the new exposure equipment. Without such a development, it is difficulty to form a fine pattern in semiconductor devices.

FIGS. 1a to 1c are cross-sectional views illustrating a conventional method for forming a fine pattern in a semiconductor device by using a double exposure process. As shown, a target layer 20, a hard mask layer 30, and a first photoresist film (not shown) are sequentially formed on a semiconductor substrate 10. The first photoresist film is exposed and developed using a line/space mask (not shown) to form a first photoresist pattern 40. Hard mask layer 30 is etched using first photoresist pattern 40 to form a first hard mask pattern 30a that exposes first portions of target layer 20. First photoresist pattern 40 is then removed.

Referring to FIGS. 1b and 1c, a second photoresist film (not shown) is formed on first hard mask pattern 30a and the exposed portion of target layer 20. The second photoresist film is exposed and developed using a line/space mask to form a second photoresist pattern 45. Second photoresist pattern 45 exposes portions of first hard mask pattern 30a, the exposed portions of first hard mask 30a being located substantially around the centers of two adjacent first portions of target layer 20. First hard mask pattern 30a is patterned using second photoresist pattern 45 to form a second hard mask pattern 32, thereby exposing second portions of target layer 20. Second photoresist pattern 45 is then removed. Target layer 20 is etched using second hard mask pattern 32 to form a target pattern 20a.

According to the above described method, it may be difficult to form a fine pattern due to the resolution limit of the exposure equipment. In addition, there may be a misalignment issue between two patterns that are formed by the two-step exposing process to overcome the resolution limit.

SUMMARY

Embodiments consistent with the present invention relate to a method for forming a fine pattern in a semiconductor device. According to one embodiment, the method comprises performing a selective etching process by using an etching selectivity between a polysilicon material and an oxide material. The fine pattern has a critical dimension ("CD") that overcomes the resolution limit of an exposure equipment.

According to one aspect of the present invention, a method is provided for forming a fine pattern in a semiconductor device. The method includes: providing a semiconductor substrate; forming a target layer over the semiconductor substrate, and forming a hard mask layer over the target layer; forming a first oxide film pattern over the hard mask layer, and forming a nitride film pattern over the first oxide film pattern, thereby selectively exposing a portion of the hard mask layer; forming a first polysilicon layer having a first thickness over the exposed portion of the hard mask layer, the first oxide film pattern, and the nitride film pattern; forming a second oxide film having a second thickness over the first polysilicon layer; forming a second polysilicon layer having a third thickness over the second oxide film; planarizing the second polysilicon layer, the second oxide film, and the first polysilicon layer until the nitride film pattern is exposed; removing the nitride film pattern to expose the first oxide film pattern; etching the first oxide film pattern and the second oxide film according to an etching selectivity between an oxide material and a polysilicon material; etching the hard mask layer by using top portions of the first polysilicon layer and the second polysilicon layer as an etching mask to form a hard mask layer pattern; and etching the target layer by using the hard mask layer pattern as an etching mask to form a fine pattern.

According to another aspect of the present invention, a semiconductor device may comprise a semiconductor substrate, and a fine pattern formed on the semiconductor substrate. The fine pattern is formed according to the method described above.

DETAILED DESCRIPTION

Figure 1A:
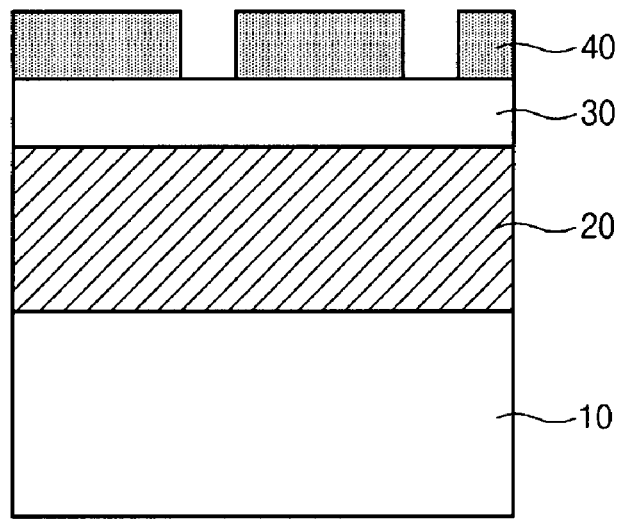
FIGS. 1a to 1c are cross-sectional views illustrating a conventional method for forming a fine pattern in a semiconductor device.
Figure 1B:
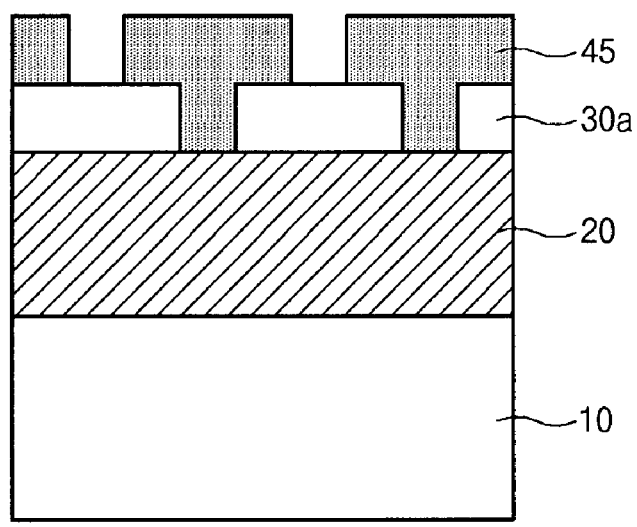
Figure 1C:
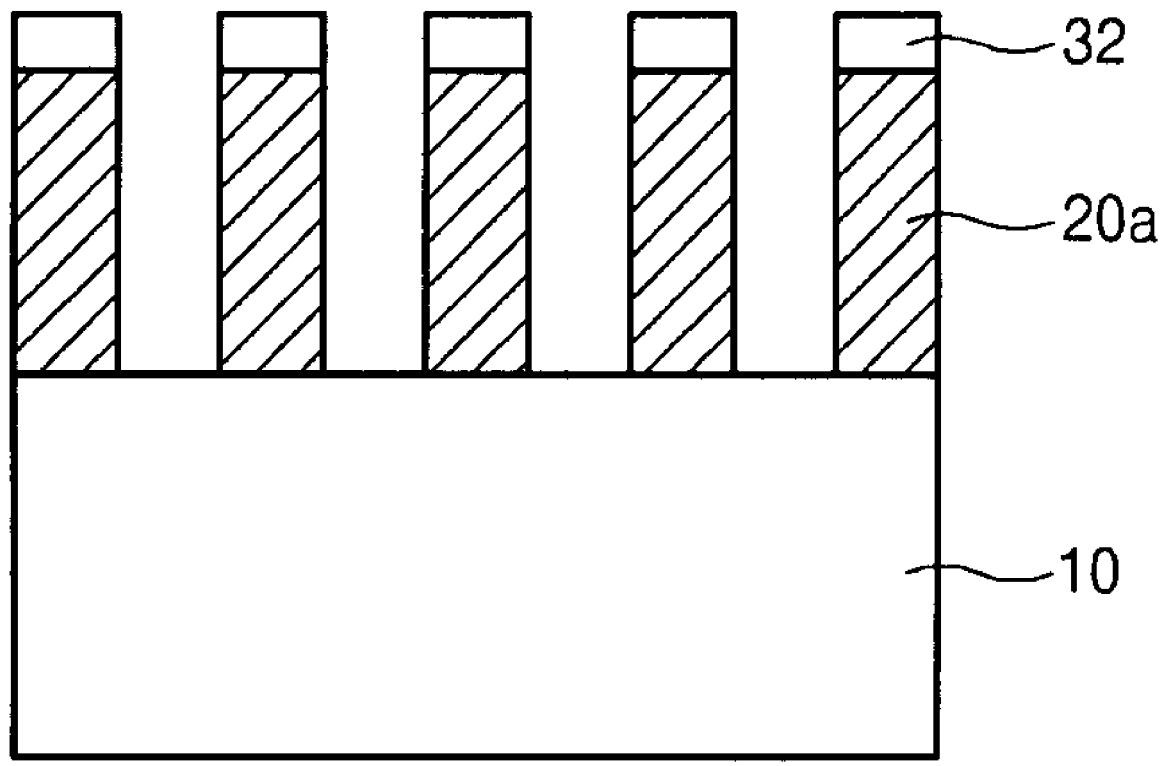
Figure 2A:
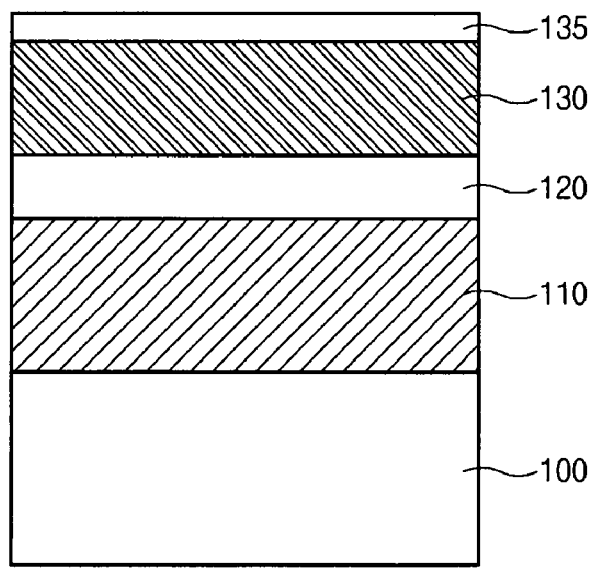
FIGS. 2a to 2h are cross-sectional views illustrating a method for forming a fine pattern in a semiconductor device consistent with the present invention.

FIGS. 2a to 2h are cross-sectional views illustrating a method for forming a fine pattern in a semiconductor device consistent with the present invention. As shown in FIG. 2a, a target layer 110, a first amorphous carbon layer 120, a first boro-phosphor-silicate-glass ("BPSG") oxide film 130, and a nitride film 135 are sequentially formed over a semiconductor substrate 100. Target layer 110 may comprise an oxide film formed at a temperature in a range of about 100° C. to 600° C. with a thickness in a range of about 100 nm to 1,000 nm. First amorphous carbon layer 120 may include a hard mask layer, which may have a thickness in a range of about 100 nm to 500 nm. Further, first BPSG oxide film 130 may have a thickness in a range of about 100 nm to 1,000 nm.

Figure 2B:
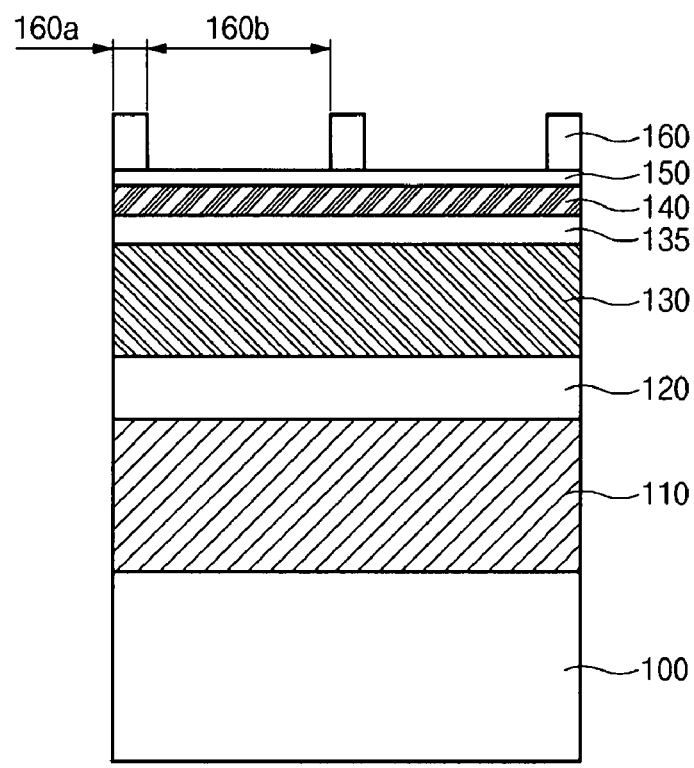

Referring to FIG. 2b, a second amorphous carbon layer 140 and an anti-reflection film 150 are sequentially formed over nitride film 135. Second amorphous carbon layer 140 may have a thickness in a range of about 100 nm to 500 nm. Anti-reflection film 150 may have a thickness in a range of about 30 nm to 40 nm, or in a range of about 31 nm to 35 nm. A photoresist film (not shown) sensitive to ArF laser is formed over anti-reflection film 150. The photoresist film may have a thickness in a range of about 100 nm to 500 nm. The photoresist film is then exposed and developed using a line/space exposure mask to form a photoresist pattern 160. Photoresist pattern 160 includes line patterns, each having a line width 160a. Two neighboring line patterns may be separated by a width 160b. In one embodiment, a ratio between line width 160a and width 160b may be about 1:5. For example, when a pitch of the exposure mask is about 240 nm, line width 160a may be about 40 nm, and line width 160b may be about 200 nm. Other pitch or width number may also be used. An exposure process may be performed using a light source such as ArF laser (193 nm).

Figure 2C:
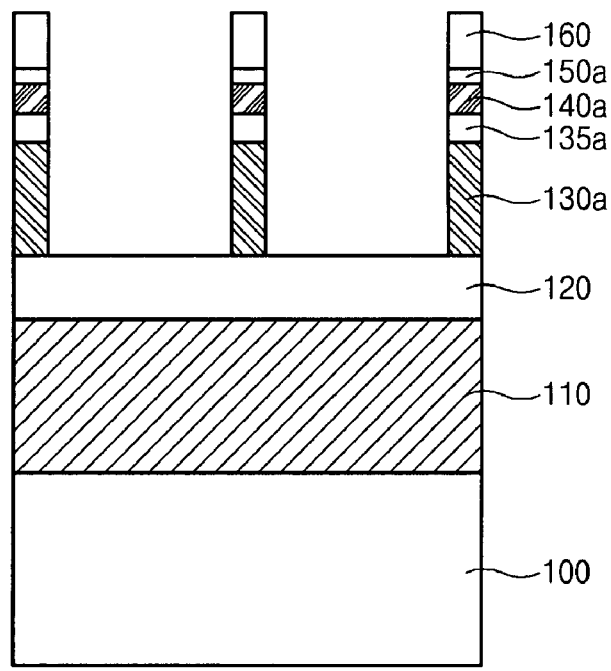
Figure 2D:
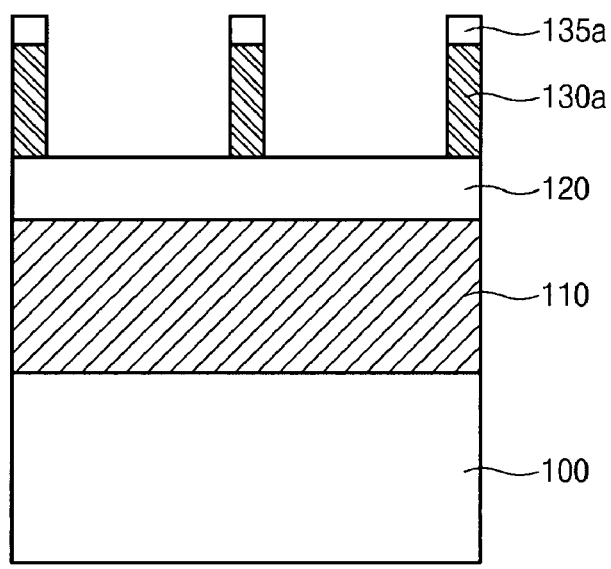

Referring to FIGS. 2c and 2d, anti-reflection film 150, second amorphous carbon layer 140, nitride film 135, and first BPSG oxide film 130 are sequentially etched, using photoresist pattern 160 as an etching mask, to form a first BPSG oxide pattern 130a, a nitride pattern 135a, a second amorphous carbon pattern 140a, and an anti-reflection pattern 150a, thereby exposing a portion of first amorphous carbon layer 120. Photoresist pattern 160, anti-reflection pattern 150a, and second amorphous carbon pattern 140a are then removed, as shown in FIG. 2d.

Figure 2E:
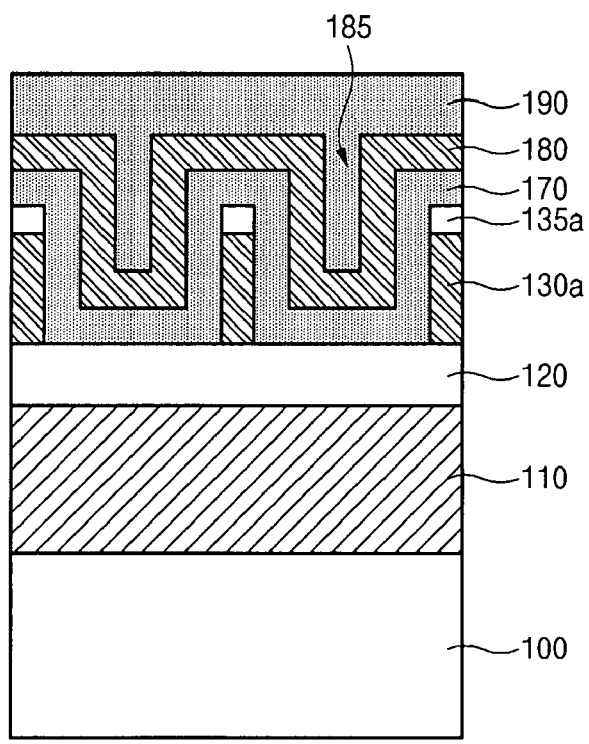

Referring to FIG. 2e, a first polysilicon layer 170 is formed over semiconductor substrate 100 to cover the exposed portion of first amorphous carbon layer 120, first BPSG oxide pattern 130a, and nitride pattern 135a. A second BPSG oxide film 180 that have substantially the same thickness as that of first polysilicon layer 170 are formed over first polysilicon layer 170. Thicknesses of first polysilicon layer 170 and second BPSG oxide film 180 may be in a range of about 30 nm to 50 nm, or in a range of about 35 nm to 45 nm. First polysilicon layer 170 and second BPSG oxide film 180 may be formed to have a substantially uniform thickness depending on a step difference of the lower portion. The thickness of second BPSG oxide film 180 is substantially equal to a critical dimension ("CD") of fine patterns to be formed. A second polysilicon layer 190 is formed over second BPSG oxide film 180 and fills a space 185 between two adjacent vertical portions of second BPSG oxide film 180. Second polysilicon layer 190 may have a thickness in a range of about 100 nm to 500 nm measured from a top surface of second BPSG oxide pattern 180.

Figure 2F:
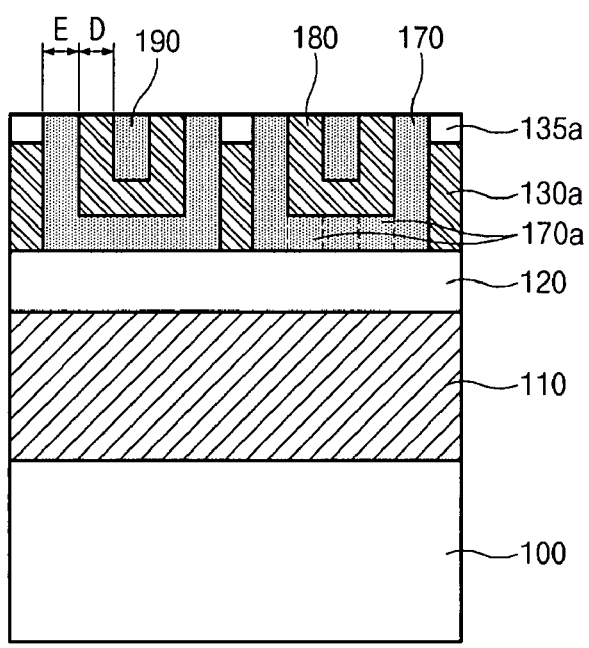

Referring to FIG. 2f, a planarization process may be performed on second polysilicon layer 190, second BPSG oxide film 180, and first polysilicon layer 170 to expose nitride pattern 135a. Nitride pattern 135a is then removed to expose first oxide pattern 130a. A ratio between a line width D of BPSG oxide film 180 and a width E of polysilicon layer 170 may be about 1:1.

Figure 2G:
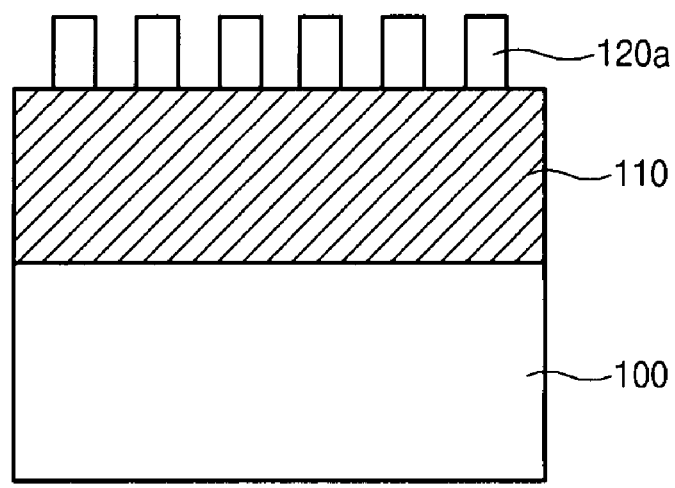

Referring to FIG. 2g, first BPSG oxide pattern 130a and second BPSG oxide film 180 disposed between first polysilicon layer 170 and second polysilicon layer 190 are removed by a selective etching process. Hard mask layer 120 is etched using first polysilicon layer 170 and second polysilicon layer 190 as etching masks, to form a hard mask pattern 120a. In one embodiment, the selective etching process may be performed by taking advantage of an etching selectivity between polysilicon layers and oxide films. An etching selectivity of BPSG oxide film 180 and first and second polysilicon layers 170 and 190 may be about 20:1. In other words, BPSG oxide film 180 may be etched about twenty times faster than first and second polysilicon layers 170 and 190 are etched. Because of the etching selectivity, when the top portions of first polysilicon layer 170 and second polysilicon layer 190 are etched, bottom portions 170a of first polysilicon layer 170 are also etched using the top portions of first and second polysilicon layers 170 and 190 as an etching mask. By continuing the selective etching process, hard mask pattern 120a is formed. In one embodiment, when hard mask layer 120 is etched, first polysilicon layer 170 and second polysilicon layer 190 may be removed at the same time.

Figure 2H:
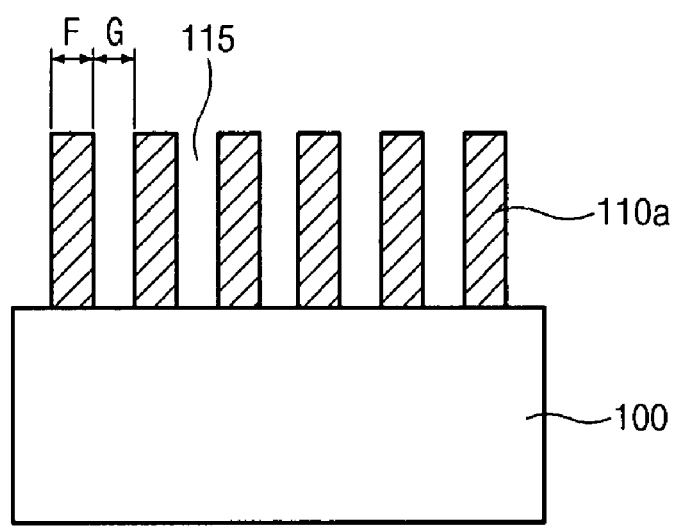

Referring to FIG. 2h, target layer 110 is etched using hard mask pattern 120a as a mask to form a fine pattern 110a. Accordingly, as shown in FIG. 2h, a semiconductor device including semiconductor substrate 100 and fine pattern 110a formed over semiconductor substrate 100 is constructed. A ratio between line width F of fine pattern 110a and width G of a space 115 obtained from the etching of target layer 110 is about 1:1. Line width F of fine pattern 110a can be determined according to the thickness of second BPSG oxide film 180 shown in FIG. 2e.

As described above, in a method for forming a fine pattern of a semiconductor device according to an embodiment consistent with the present invention, a line/space fine pattern can be formed to overcome the resolution limit of an exposure equipment. Also, the method may prevent pattern misalignments generated in an exposure process, thereby improving the characteristics of semiconductor devices.

The above embodiments consistent with the present invention are illustrative and not limitative. Various alternatives and equivalents are possible. The present invention is not limited by the types of deposition, etching, polishing, and/or patterning steps described herein. Nor is the present invention limited to any specific types of semiconductor devices. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for forming a fine pattern in a semiconductor device, the method comprising:
   providing a semiconductor substrate;
   forming a target layer over the semiconductor substrate, and forming a hard mask layer over the target layer;

forming a first oxide film pattern over the hard mask layer, and forming a nitride film pattern over the first oxide film pattern, thereby selectively exposing a portion of the hard mask layer;

forming a first polysilicon layer having a first thickness over the exposed portion of the hard mask layer, the first oxide film pattern, and the nitride film pattern;

forming a second oxide film having a second thickness over the first polysilicon layer;

forming a second polysilicon layer having a third thickness over the second oxide film;

planarizing the second polysilicon layer, the second oxide film, and the first polysilicon layer until the nitride film pattern is exposed;

removing the nitride film pattern to expose the first oxide film pattern;

etching the first oxide film pattern and the second oxide film according to an etching selectivity between an oxide material and a polysilicon material;

etching the hard mask layer by using top portions of the first polysilicon layer and the second polysilicon layer as an etching mask to form a hard mask layer pattern; and etching the target layer by using the hard mask layer pattern as an etching mask to form the fine pattern.

2. The method of claim 1, wherein the target layer comprises an oxide film.

3. The method of claim 1, wherein the target layer is formed under a temperature in a range of about 100° C. to 600° C. with a thickness in a range of about 100 nm to 1,000 nm.

4. The method of claim 1, wherein the hard mask layer comprises an amorphous carbon layer.

5. The method of claim 1, wherein the hard mask layer has a thickness in a range of about 100 nm to 500 nm.

6. The method of claim 1, wherein the first oxide film pattern comprises a boro-phosphor-silicate-glass (BPSG) oxide film, and the second oxide film comprises a BPSG oxide film.

7. The method of claim 1, wherein the first oxide film pattern has a thickness in a range of about 100 nm to 1,000 nm.

8. The method of claim 1, wherein a ratio of a line width of the first oxide film pattern to a width of a space defined between the neighboring first oxide film patterns is about 1:5.

9. The method of claim 1, wherein the first thickness is substantially the same as the second thickness, both the first thickness and the second thickness being in a range of about 30 nm to 50 nm.

10. The method of claim 1, wherein the third thickness is in a range of about 100 nm to 500 nm measured from a top surface of the second oxide film.

11. The method of claim 1, wherein the etching selectivity includes etching the oxide material twenty times faster than etching the polysilicon material.

12. The method of claim 1, wherein a ratio between a line width of the fine pattern and a width of a space obtained from etching the target layer is about 1:1.

* * * * *